United States Patent
Chiu et al.

(10) Patent No.: US 11,133,245 B2
(45) Date of Patent: Sep. 28, 2021

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Chi-Tsung Chiu, Kaohsiung (TW); Hui-Ying Hsieh, Kaohsiung (TW); Kuo-Hua Chen, Kaohsiung (TW); Cheng Yuan Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 56 days.

(21) Appl. No.: 16/664,631

(22) Filed: Oct. 25, 2019

(65) Prior Publication Data
US 2021/0125911 A1  Apr. 29, 2021

(51) Int. Cl.
| H01L 23/48 | (2006.01) |
| H01L 23/498 | (2006.01) |
| H01L 21/768 | (2006.01) |
| H01L 23/495 | (2006.01) |

(52) U.S. Cl.
CPC .. *H01L 23/49827* (2013.01); *H01L 21/76885* (2013.01); *H01L 23/49568* (2013.01)

(58) Field of Classification Search
CPC ......... H01L 23/49827; H01L 23/49568; H01L 21/76885
USPC ........................................ 257/774, 666, 676
See application file for complete search history.

(56) References Cited

U.S. PATENT DOCUMENTS

| 5,111,278 | A  | * | 5/1992  | Eichelberger | ......... H01L 23/473   257/698 |
| 5,763,952 | A  | * | 6/1998  | Lynch        | ................ G01R 1/07342   257/735 |
| 5,945,741 | A  | * | 8/1999  | Ohsawa       | ................. H01L 23/24 |
| 6,709,897 | B2 | * | 3/2004  | Cheng        | ..................... H01L 24/05   438/121 |
| 6,828,669 | B2 | * | 12/2004 | Iijima       | .................... H05K 1/111   257/700 |
| 7,727,813 | B2 |   | 6/2010  | Otremba et al. | |
| 8,084,816 | B2 |   | 12/2011 | Otremba et al. | |
| 8,130,507 | B2 | * | 3/2012  | Origuchi     | ................ H05K 1/162   361/760 |
| 2003/0141105 | A1 | * | 7/2003 | Sugaya       | ................... H01L 21/56   174/256 |
| 2010/0148346 | A1 | * | 6/2010 | Quinones     | ................ H01L 24/37   257/690 |
| 2013/0171774 | A1 | * | 7/2013 | Chen         | ..................... H01L 25/105   438/121 |
| 2019/0189572 | A1 | * | 6/2019 | Chiang       | .............. H01L 23/5389 |

* cited by examiner

*Primary Examiner* — Nitin Parekh
(74) *Attorney, Agent, or Firm* — Foley & Lardner LLP

(57) ABSTRACT

A semiconductor package structure includes a base, at least one semiconductor element, a first dielectric layer, a second dielectric layer and a circuit layer. The semiconductor element is disposed on the base and has an upper surface. The first dielectric layer covers at least a portion of a peripheral surface of the semiconductor element and has a top surface. The top surface is non-coplanar with the upper surface of the semiconductor element. The second dielectric layer covers the semiconductor element and the first dielectric layer. The circuit layer extends through the second dielectric layer to electrically connect the semiconductor element.

17 Claims, 24 Drawing Sheets

SEMICONDUCTOR PACKAGE STRUCTURE AND METHOD FOR MANUFACTURING THE SAME

BACKGROUND

1. Field of the Disclosure

The present disclosure relates to a semiconductor package structure and a manufacturing method, and to a semiconductor package structure including a first dielectric layer covering a portion of a semiconductor element, and a method for manufacturing the same.

2. Description of the Related Art

As for embedded chip package structures, many via holes are formed to electrically connect chips by laser drilling. However, the use of laser drilling increases manufacturing cost. In addition, circuit layers of the embedded chip package structure are covered by a protection layer (e.g., solder mask), thus the heat generated by the chips while in operation is difficult to dissipate through the circuit layers.

SUMMARY

In some embodiments, a semiconductor package structure includes a base, at least one semiconductor element, a first dielectric layer, a second dielectric layer and a circuit layer. The semiconductor element is disposed on the base and has an upper surface. The first dielectric layer covers at least a portion of a peripheral surface of the semiconductor element and has a top surface. The top surface is non-coplanar with the upper surface of the semiconductor element. The second dielectric layer covers the semiconductor element and the first dielectric layer. The circuit layer extends through the second dielectric layer to electrically connect the semiconductor element.

In some embodiments, a semiconductor package structure includes a base, at least one semiconductor element, a first dielectric layer, a second dielectric layer and a circuit layer. The base has a surface and includes at least one conductive pillar protruding from the surface. The semiconductor element is disposed on the surface of the base. The first dielectric layer covers a portion of the conductive pillar and a portion of the semiconductor element. The conductive pillar protrudes from a top surface of the first dielectric layer. The second dielectric layer covers the conductive pillar, the semiconductor element and the first dielectric layer. The circuit layer extends through the second dielectric layer to electrically connect the semiconductor element.

In some embodiments, a method for manufacturing a semiconductor package structure includes: (a) providing a base; (b) disposing at least one semiconductor element on the base; (c) forming a first dielectric layer to cover the base and a portion of the semiconductor element; (d) forming a second dielectric layer to cover the semiconductor element and the first dielectric layer, wherein the second dielectric layer is made from a photosensitive material; and (e) forming a circuit layer extending through the second dielectric layer to electrically connect the semiconductor element.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
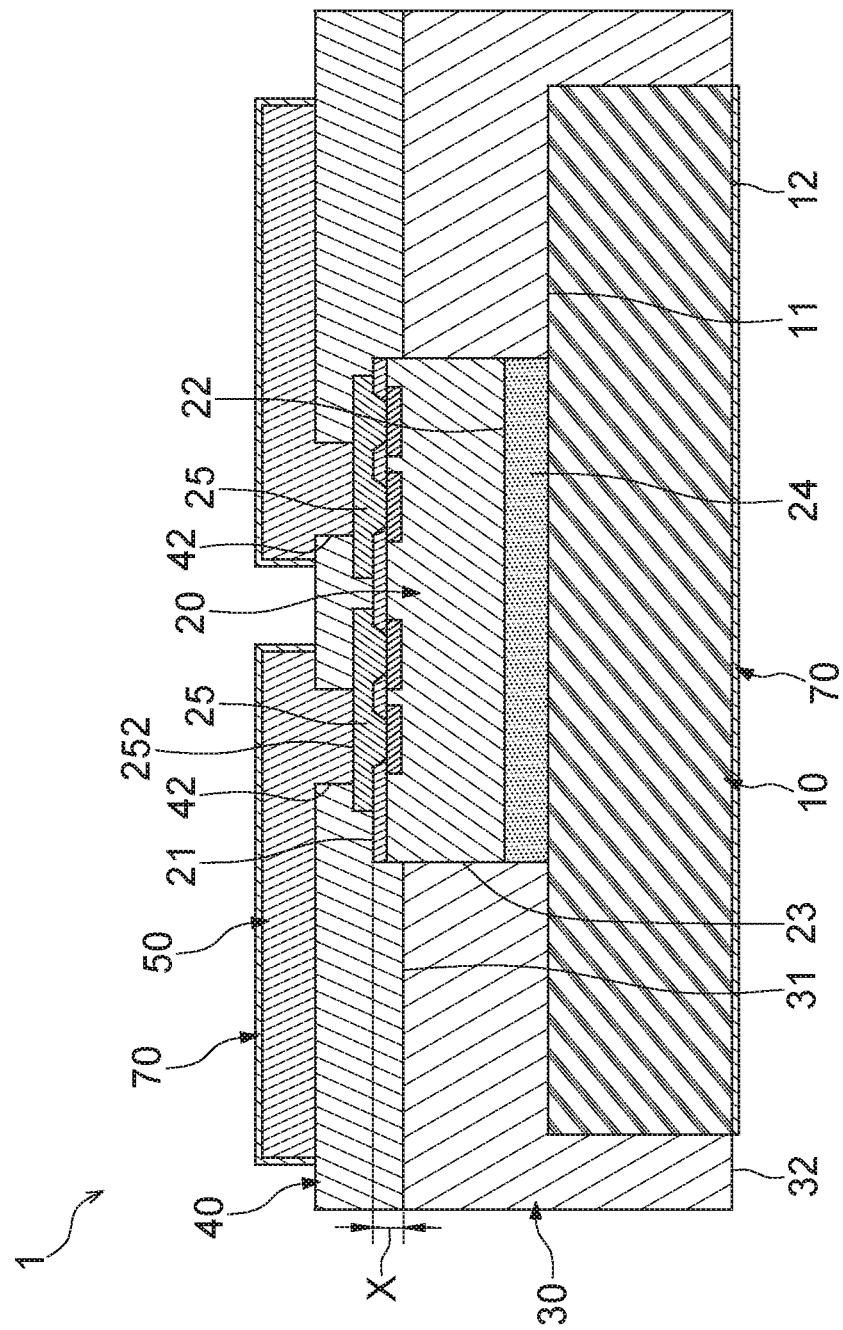
FIG. 1 illustrates a cross-sectional view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure provide for a semiconductor package structure which may improve heat dissipation and reduced manufacturing cost. In some embodiments, the semiconductor package structure includes a first dielectric layer covering a portion of a semiconductor element. At least some embodiments of the present disclosure further provide for techniques for manufacturing the semiconductor package structure.

FIG. 1 illustrates a cross-sectional view of a semiconductor package structure 1 according to some embodiments of the present disclosure. The semiconductor package structure 1 includes a base 10, at least one semiconductor element 20, a first dielectric layer 30, a second dielectric layer 40, a circuit layer 50 and a surface finishing layer 70.

The base 10 may be, for example, a lead frame or a substrate. The base 10 has a top surface 11 and a bottom surface 12 opposite to the top surface 11. A material of the base 10 may include metal such as copper. Thus, the base 10 may be a heat dissipating element.

The semiconductor element 20 may be, for example, a power chip or a power die. A material of the semiconductor element 20 may be Silicon (Si), Silicon Carbide (SiC), Gallium Nitride (GaN), or the other suitable material. The semiconductor element 20 is disposed on the top surface 11 of the base 10. The semiconductor element 20 has an upper surface 21 (e.g., an active surface), a lower surface 22 (e.g., a backside surface) opposite to the upper surface 21 and a peripheral surface 23 extending between the upper surface 21 and the lower surface 22. In some embodiments, the lower surface 22 of the semiconductor element 20 may be bonded to the top surface 11 of the base 10 through an adhesive 24. As shown in FIG. 1, the semiconductor element 20 includes a plurality of first terminals 25 disposed adjacent to the upper surface 21. In some embodiments, the first terminals 25 may include at least one source terminal, at least one gate terminal and at least one drain terminal.

The first dielectric layer 30 covers a portion of the semiconductor element 20 and a portion of the base 10. The material of the first dielectric layer 30 may be, for example, polypropylene (PP). In some embodiments, a plurality of glass fibers may be embedded in the first dielectric layer 30 to improve the material strength of the first dielectric layer 30. The first dielectric layer 30 has a top surface 31 and a bottom surface 32 opposite to the top surface 31. In some embodiments, the first dielectric layer 30 may cover at least a portion of the peripheral surface 23 of the semiconductor element 20, thus the top surface 31 of the first dielectric layer 30 may be substantially non-coplanar with the upper surface 21 of the semiconductor element 20.

In some embodiments, the top surface 31 of the first dielectric layer 30 may be lower than the upper surface 21 of the semiconductor element 20. Thus, there is a height difference X between the top surface 31 of the first dielectric layer 30 and the upper surface 21 of the semiconductor element 20. That is, a top portion of the semiconductor element 20 may protrude from the first dielectric layer 30. The height difference X may be less than or equal to about 30 µm to prevent the first dielectric layer 30 from covering the upper surface 21 of the semiconductor element 20. Alternatively, the height difference X may be greater than or equal to about 5 µm. In some embodiments, the height difference X may be about 5 µm to about 30 µm. Further, the bottom surface 32 of the first dielectric layer 30 may be substantially coplanar with the bottom surface 12 of the base 10.

The second dielectric layer 40 covers the semiconductor element 20 and the first dielectric layer 30. The second dielectric layer 40 may be made from a photosensitive material or photoimageable material such as a solder mask, thus the second dielectric layer 40 may define a plurality of openings 42 extending through the second dielectric layer 40 to expose a portion (e.g., a portion of a top surface 252) of each of the first terminals 25 by, for example, exposure and development processes. Since the openings 42 are not formed by laser drilling, the manufacturing cost may be reduced.

The circuit layer 50 extends through the second dielectric layer 40 to electrically connect the semiconductor element 20. In some embodiments, the circuit layer 50 may be disposed on the second dielectric layer 40 and extends into the openings 42 of the second dielectric layer 40. Further, the circuit layer 50 may electrically connect or contact the exposed portion (e.g., the exposed portion of the top surface 252) of each of the first terminals 25.

The surface finishing layer 70 covers the circuit layer 50 and the bottom surface 12 of the base 10 to prevent the circuit layer 50 and the base 10 from oxidation.

As shown in the embodiment illustrated in FIG. 1, the circuit layer 50 does not covered by the second dielectric layer 40, thus the heat generated by the semiconductor element 20 while in operation may be dissipated through the circuit layer 50. Further, the top surface 31 of the first dielectric layer 30 is substantially non-coplanar with the upper surface 21 of the semiconductor element 20, thus the stress concentration phenomenon may not occur at corners of the semiconductor element 20, thereby preventing the first dielectric layer 30 and the second dielectric layer 40 form peeling off from the corners of the semiconductor element 20. In addition, the openings 42 of the second dielectric layer 40 may be formed by exposure and development processes, thus, a width of the opening 42 may be relatively large (e.g., a width of the opening 42 may be 200 μm or greater), and the depth of the opening 42 may be relatively small (e.g., a depth of the opening 42 may be 15 μm to 25 μm). Thus, a relatively large electrical current may be transmitted through a portion of the circuit layer 50 in the opening 42, and the electrical path through the portion of the circuit layer 50 in the opening 42 is shortened.

Figure 2:
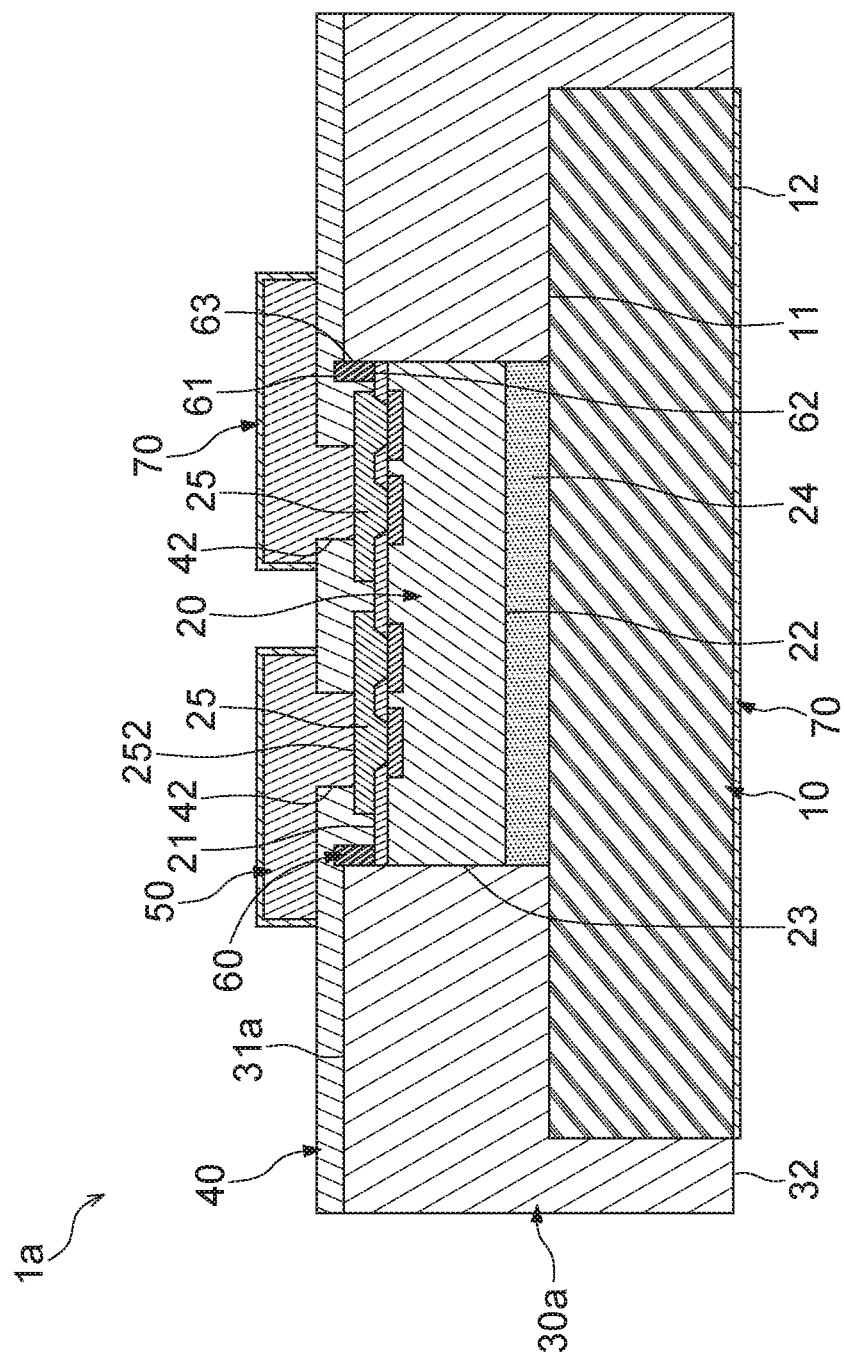
FIG. 2 illustrates a cross-sectional view of a semiconductor package structure according to some embodiments of the present disclosure.

FIG. 2 illustrates a cross-sectional view of a semiconductor package structure 1a according to some embodiments of the present disclosure. The semiconductor package structure 1a is similar to the semiconductor package structure 1 shown in FIG. 1, except that the semiconductor package structure 1a further includes at least one dam 60, and the top surface 31a of the first dielectric layer 30a is higher than the upper surface 21 of the semiconductor element 20.

The dam 60 may be disposed on the upper surface 21 of the semiconductor element 20 to surround the first terminals 25. In some embodiments, the dam 60 may be in a ring shape from a top view and may be disposed at the periphery of the upper surface 21 of the semiconductor element 20. In addition, the dam 60 may protrude from the top surface 31a of the first dielectric layer 30a to prevent the first dielectric layer 30a from covering the upper surface 21 and the first terminals 25 of the semiconductor element 20. That is, the first dielectric layer 30a covers a portion of the dam 60 and a whole of the peripheral surface 23 of the semiconductor element 20. As shown in FIG. 2, the dam 60 has an upper surface 61 higher than the top surface 31a of the first dielectric layer 30a, a lower surface 62 opposite to the upper surface 61 and an outer lateral surface 63 extending between the upper surface 61 and the lower surface 62. The lower surface 62 may be attached to the upper surface 21 of the semiconductor element 20. The first dielectric layer 30a may cover a portion of the outer lateral surface 63. Further, the second dielectric layer 40 may cover the dam 60.

Figure 3:
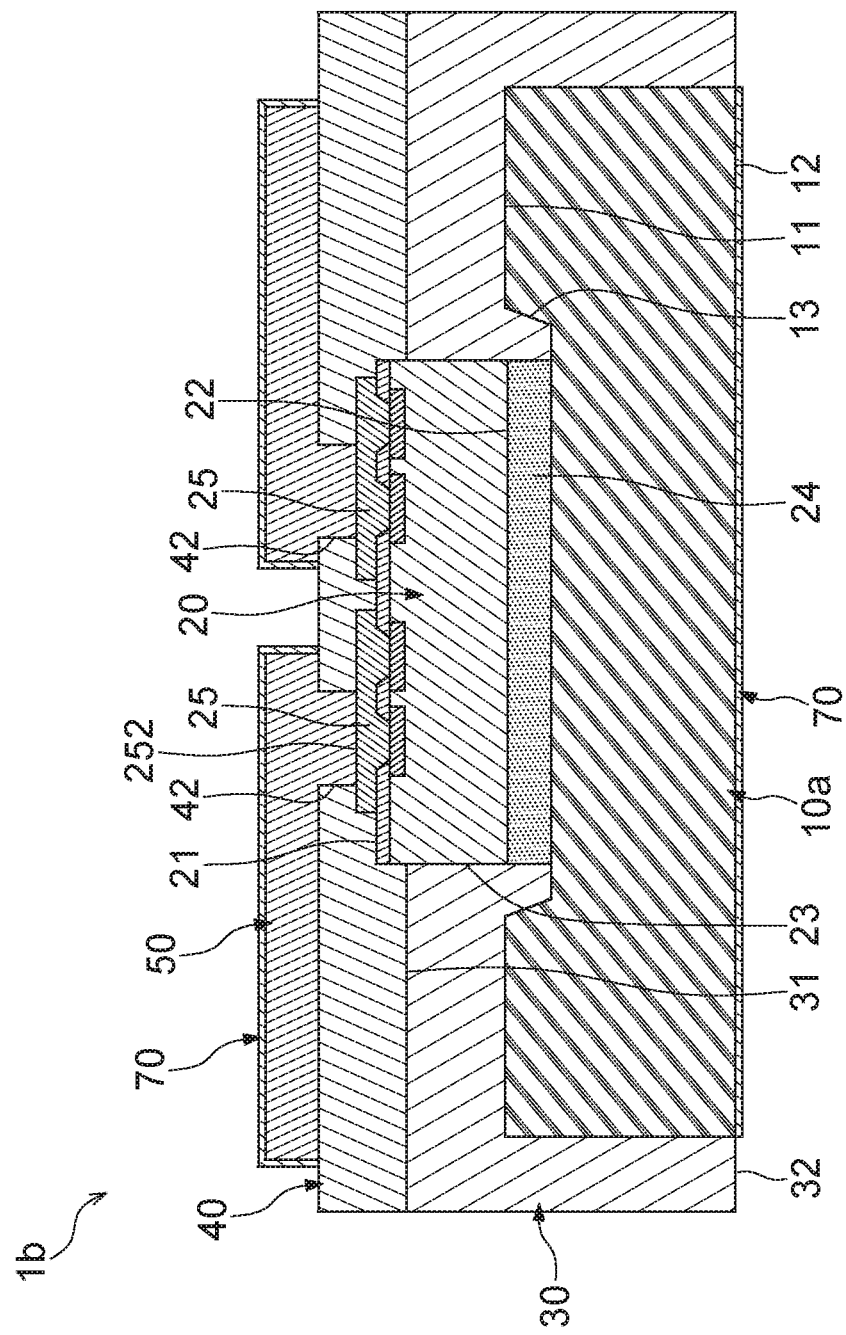
FIG. 3 illustrates a cross-sectional view of a semiconductor package structure according to some embodiments of the present disclosure.

FIG. 3 illustrates a cross-sectional view of a semiconductor package structure 1b according to some embodiments of the present disclosure. The semiconductor package structure 1b is similar to the semiconductor package structure 1 shown in FIG. 1, except for the structure of the base 10a. The base 10a of FIG. 3 further defines at least one cavity 13 recessed from the top surface 11. The semiconductor element 20 may be disposed in the cavity 13 of the base 10a. In addition, the first dielectric layer 30 may cover the cavity 13 of the base 10a.

Figure 4:
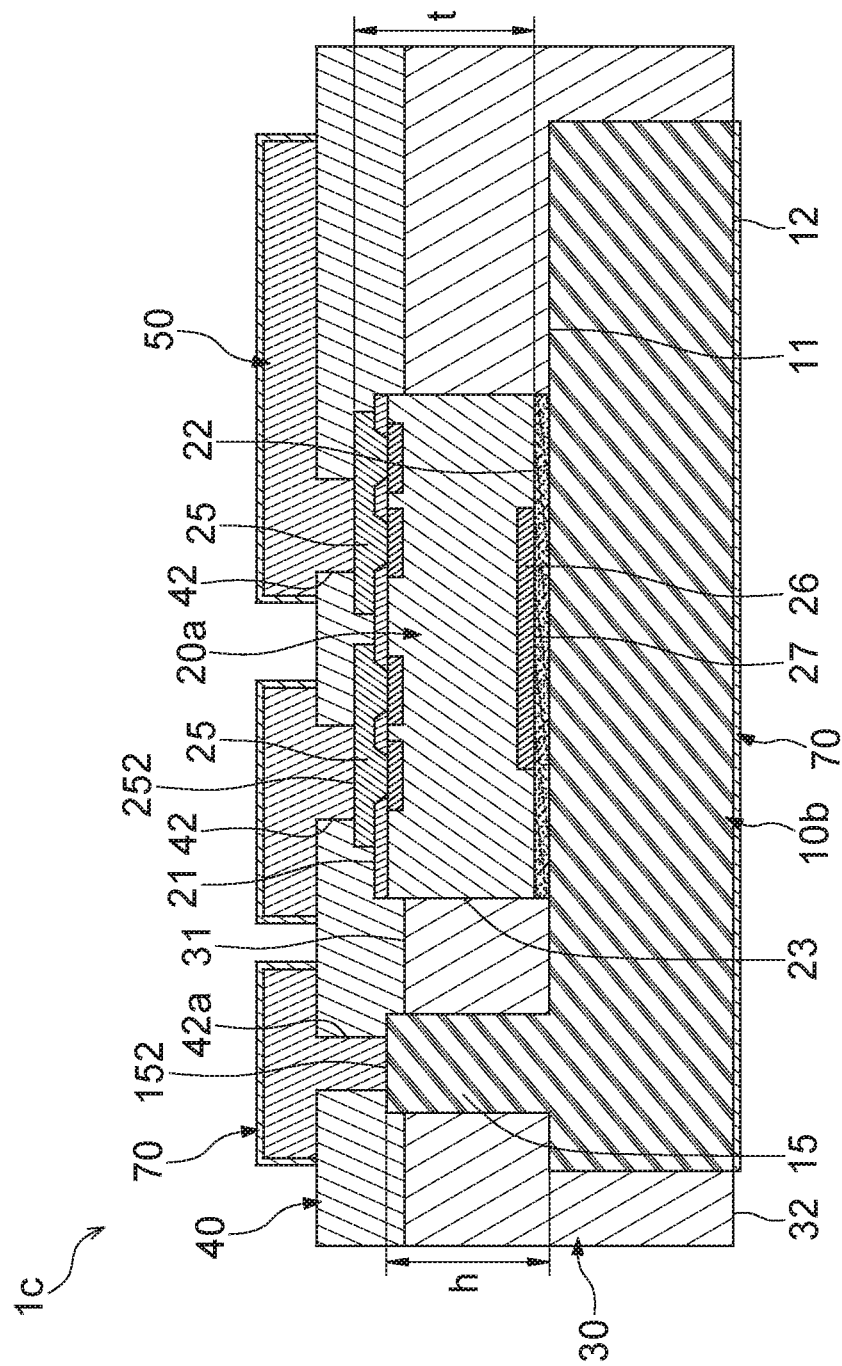
FIG. 4 illustrates a cross-sectional view of a semiconductor package structure according to some embodiments of the present disclosure.

FIG. 4 illustrates a cross-sectional view of a semiconductor package structure 1c according to some embodiments of the present disclosure. The semiconductor package structure 1c is similar to the semiconductor package structure 1 shown in FIG. 1, except for the structures of the base 10b and the semiconductor element 20a. The base 10b of FIG. 4 further includes at least one conductive pillar 15 protruding from the top surface 11. The conductive pillar 15 and the base 10b may be formed concurrently. The semiconductor element 20a of FIG. 4 further includes at least one second terminal 26 disposed adjacent to the lower surface 22. The second terminal 26 may be electrically connected to the conductive pillar 15 through the base 10b. In some embodiments, the second terminal 26 may be electrically connected to the base 10b through a conductive adhesive 27.

In some embodiments, the second terminal 26 may be a drain terminal, and the first terminals 25 may include at least one source terminal and at least one gate terminal.

The conductive pillar 15 may be spaced apart from the semiconductor element 20a. In some embodiments, a height h of the conductive pillar 15 may be less than a thickness t of the semiconductor element 20a. That is, a top surface 152 of the conductive pillar 15 may be lower than the upper surface 21 of the semiconductor element 20a.

In some embodiments, the conductive pillar 15 may protrude from the top surface 31 of the first dielectric layer 30. That is, the first dielectric layer 30 covers a portion of the conductive pillar 15. The second dielectric layer 40 may cover the conductive pillar 15. In some embodiments, the second dielectric layer 40 may further define at least one opening 42a extending through the second dielectric layer 40 to expose a portion (e.g., a portion of the top surface 152) of the conductive pillar 15. The circuit layer 50 may extend into the opening 42a and electrically connect or contact the exposed portion (e.g., the exposed portion of the top surface 152) of the conductive pillar 15.

Figure 5:
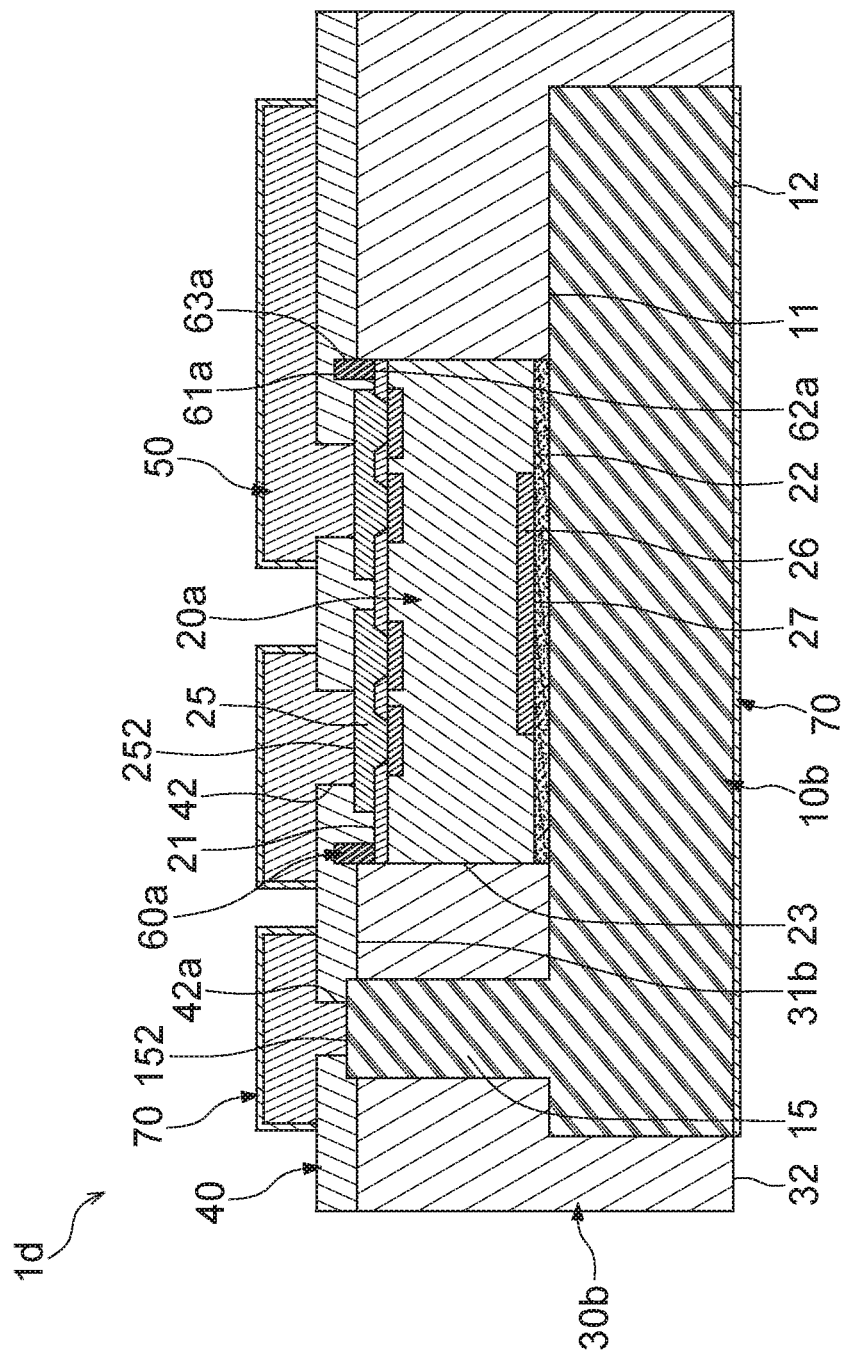
FIG. 5 illustrates a cross-sectional view of a semiconductor package structure according to some embodiments of the present disclosure.

FIG. 5 illustrates a cross-sectional view of a semiconductor package structure 1d according to some embodiments of the present disclosure. The semiconductor package structure 1d is similar to the semiconductor package structure 1c shown in FIG. 4, except that the semiconductor package structure 1d further includes at least one dam 60a, and the top surface 31b of the first dielectric layer 30b is higher than the upper surface 21 of the semiconductor element 20a. The dam 60a may be disposed on the upper surface 21 of the semiconductor element 20a to surround the first terminals 25. In addition, the dam 60a may protrude from the top surface 31b of the first dielectric layer 30b to prevent the first dielectric layer 30b from covering the upper surface 21 and the first terminals 25 of the semiconductor element 20a. That is, the first dielectric layer 30b covers a portion of the dam 60a and a whole of the peripheral surface 23 of the semiconductor element 20a. As shown in FIG. 5, the dam 60a has an upper surface 61a higher than the top surface 31b of the first dielectric layer 30b, a lower surface 62a opposite to the upper surface 61a and an outer lateral surface 63a extending between the upper surface 61a and the lower surface 62a. The first dielectric layer 30b may cover a portion of the outer lateral surface 63a.

In some embodiments, the upper surface 61a of the dam 60a may be higher than the top surface 152 of the conductive pillar 15. Further, the second dielectric layer 40 may cover the dam 60a.

Figure 6:
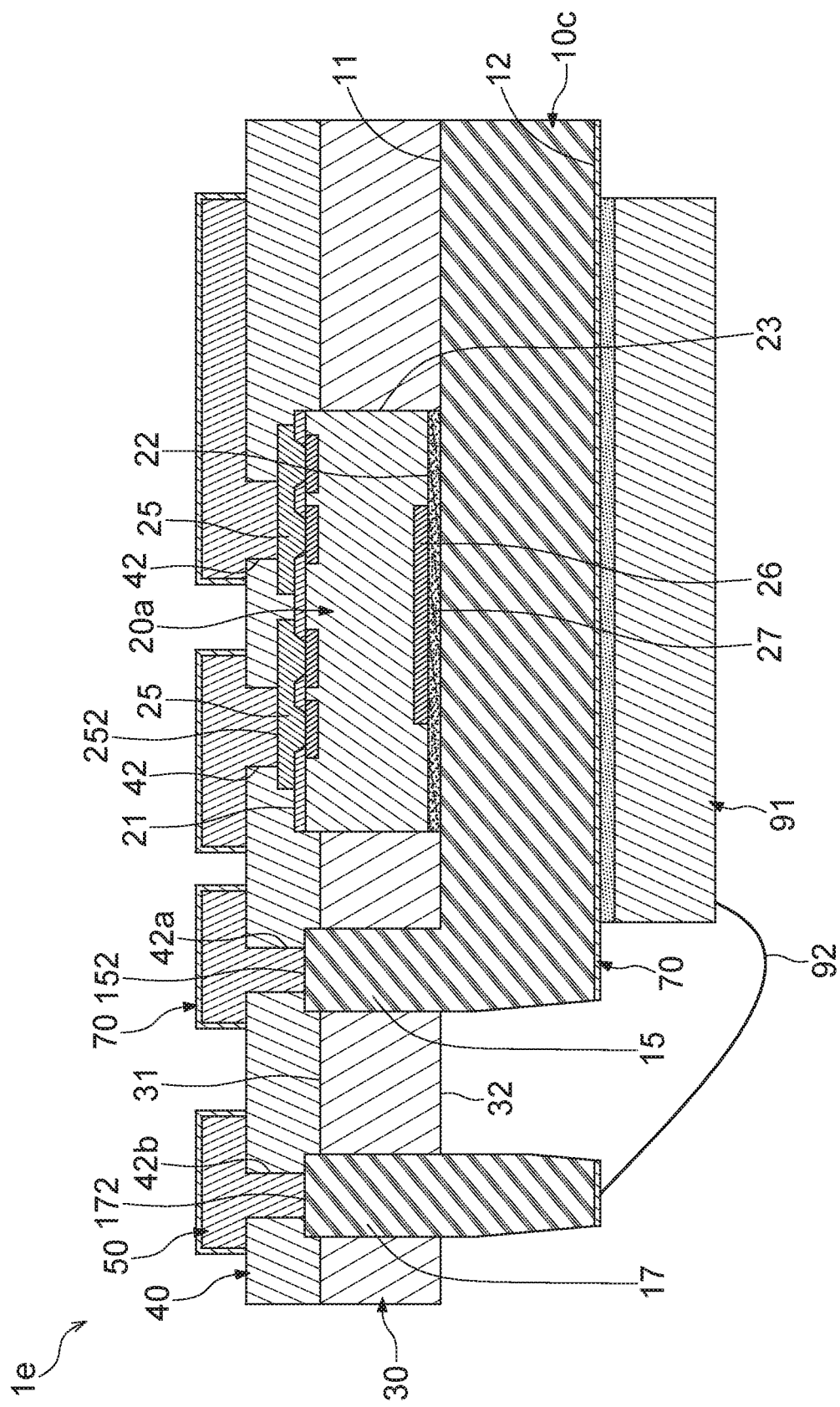
FIG. 6 illustrates a cross-sectional view of a semiconductor package structure according to some embodiments of the present disclosure.

FIG. 6 illustrates a cross-sectional view of a semiconductor package structure 1e according to some embodiments of the present disclosure. The semiconductor package structure 1e is similar to the semiconductor package structure 1c shown in FIG. 4, except that the semiconductor package structure 1e further includes at least one semiconductor device 91, and the base 10c further includes at least one conductive pin 17.

The semiconductor device 91 may be, for example, a semiconductor die or a semiconductor chip. The semiconductor device 91 may be disposed adjacent to a bottom surface 12 of the base 10c. In some embodiments, the semiconductor device 91 may be disposed adjacent to the surface finishing layer 70. Further, the semiconductor device 91 may electrically connect the conductive pin 17 through at least one bonding wire 92.

The conductive pin 17 may be spaced apart from the conductive pillar 15. In some embodiments, the conductive pin 17, the conductive pillar 15 and the base 10c may be formed concurrently. The conductive pin 17 may protrude from the top surface 31 and the bottom surface 32 of the first dielectric layer 30. That is, the first dielectric layer 30 covers a portion of the conductive pin 17. The second dielectric layer 40 may cover the conductive pin 17. In some embodiments, the second dielectric layer 40 may further define at least one opening 42b extending through the second dielectric layer 40 to expose a portion (e.g., a portion of a top surface 172) of the conductive pin 17. The circuit layer 50 may extend into the opening 42b and electrically connect or contact the exposed portion (e.g., the exposed portion of the top surface 172) of the conductive pin 17. In some embodiments, the conductive pin 17 may be a strip or a ring from a top view. However, in other embodiments, the semiconductor package structure 1e may include a plurality of conductive pins 17 arranged in a row or in a loop.

FIG. 7 through FIG. 16 illustrate a method for manufacturing a semiconductor package structure according to some embodiments of the present disclosure. In some embodiments, the method is for manufacturing a semiconductor package structure such as the semiconductor package structure 1 shown in FIG. 1.

Figure 7:
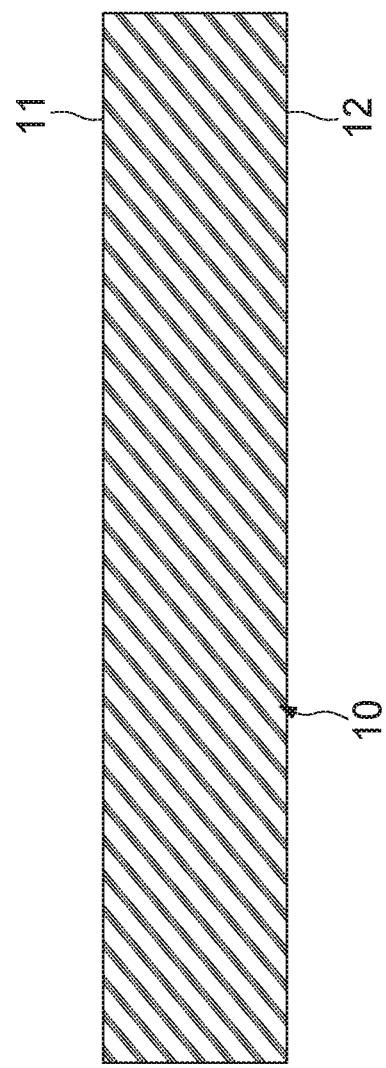
FIG. 7 illustrates one or more stages of an example of a method for manufacturing a semiconductor package structure according to some embodiments of the present disclosure.

Referring to FIG. 7, a base 10 is provided. The base 10 may be, for example, a lead frame or a substrate. The base 10 has a top surface 11 and a bottom surface 12 opposite to the top surface 11. A material of the base 10 may include metal such as copper. Thus, the base 10 may be a heat dissipating element.

Figure 8:
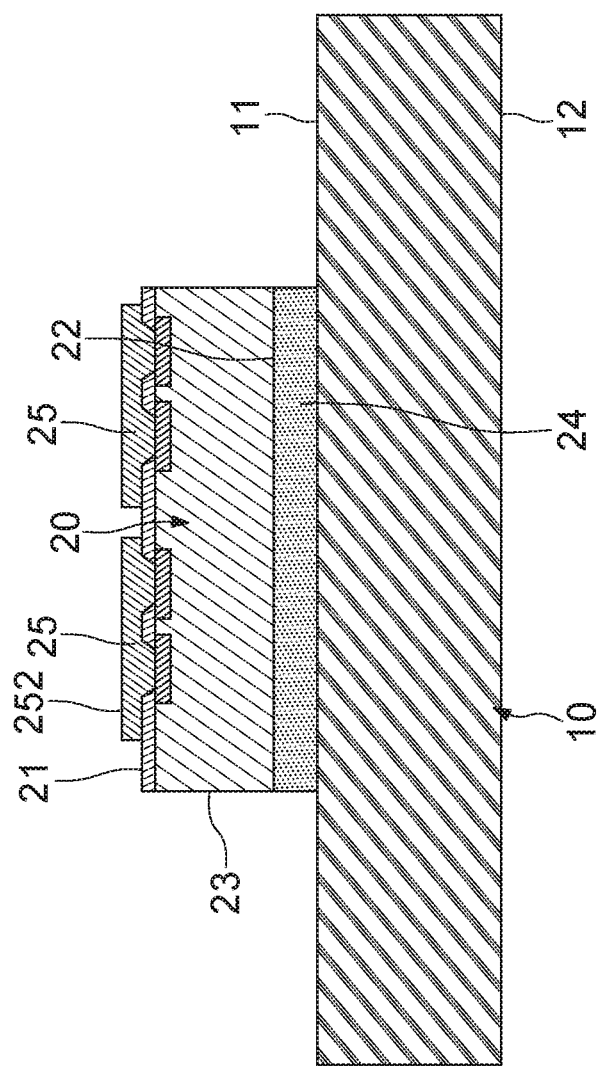
FIG. 8 illustrates one or more stages of an example of a method for manufacturing a semiconductor package structure according to some embodiments of the present disclosure.

Referring to FIG. 8, at least one semiconductor element 20 is disposed on the base 10. The semiconductor element 20 may be, for example, a power chip or a power die. A material of the semiconductor element 20 may be Silicon (Si), Silicon Carbide (SiC), Gallium Nitride (GaN), or the other suitable material. The semiconductor element 20 may be disposed on the top surface 11 of the base 10. The semiconductor element 20 has an upper surface 21 (e.g., an active surface), a lower surface 22 (e.g., a backside surface) opposite to the upper surface 21 and a peripheral surface 23 extending between the upper surface 21 and the lower surface 22. In some embodiments, the lower surface 22 of the semiconductor element 20 may be bonded to the top surface 11 of the base 10 through an adhesive 24. As shown in FIG. 8, the semiconductor element 20 includes a plurality of first terminals 25 disposed adjacent to the upper surface 21. In some embodiments, the first terminals 25 may include at least one source terminal, at least one gate terminal and at least one drain terminal.

Figure 9:
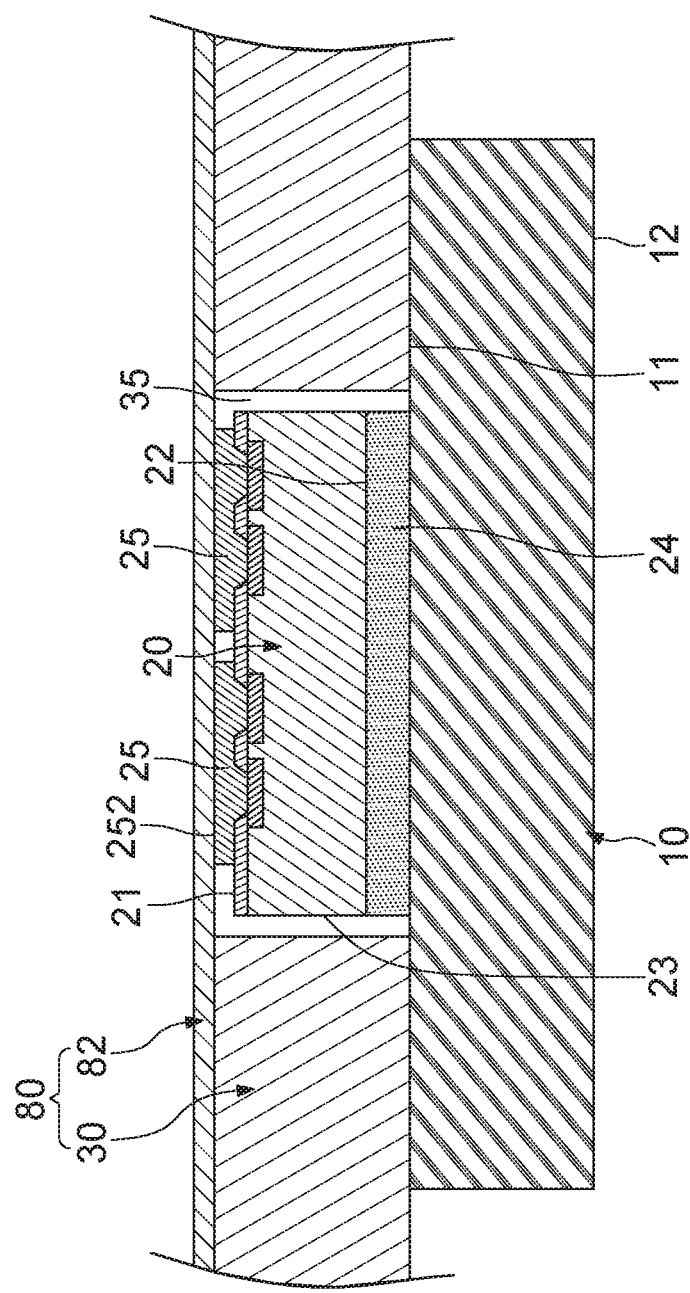
FIG. 9 illustrates one or more stages of an example of a method for manufacturing a semiconductor package structure according to some embodiments of the present disclosure.

Referring to FIG. 9 through FIG. 12, a first dielectric layer 30 is formed to cover the base 10 and a portion of the semiconductor element 20. Referring to FIG. 9, a multi-layer film 80 is provided and disposed on the base 10. The multi-layer film 80 includes a release film 82 and the first dielectric layer 30 attached on the release film 82. The material of the first dielectric layer 30 may be, for example, polypropylene (PP). In some embodiments, a plurality of glass fibers may be embedded in the first dielectric layer 30 to improve the material strength of the first dielectric layer 30. In addition, the first dielectric layer 30 may define an opening 35 to accommodate the semiconductor element 20.

Figure 10:
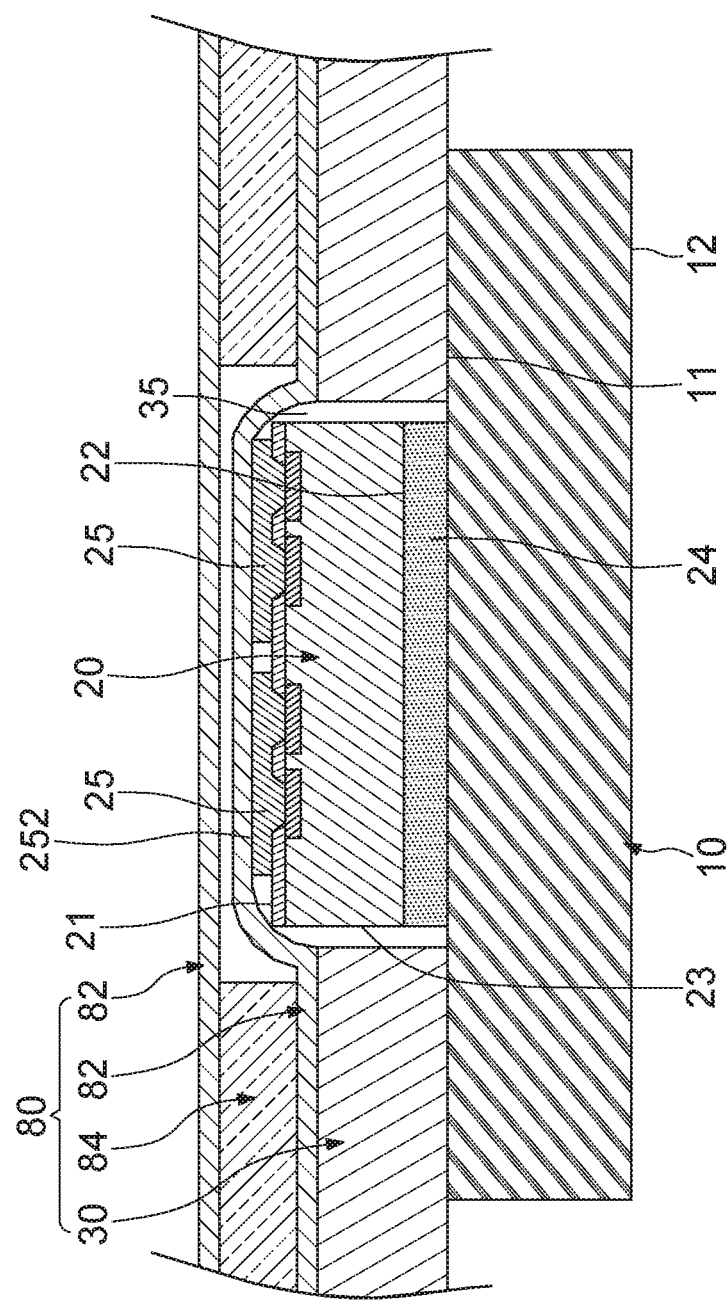
FIG. 10 illustrates one or more stages of an example of a method for manufacturing a semiconductor package structure according to some embodiments of the present disclosure.

Referring to FIG. 10, in some embodiments, the multi-layer film 80 may include two release films 82, an intermediate element 84 interposed between the two release films 82, and the first dielectric layer 30 attached on the bottom-most release film 82. The intermediate element 84 may be, for example, a copper clad laminate (CCL). The intermediate element 84 may be used to increase a total thickness of the multi-layer film 80 when the first dielectric layer 30 is thinner, to make sure the total thickness of the multi-layer film 80 is enough to be laminated in the following step.

Figure 11:
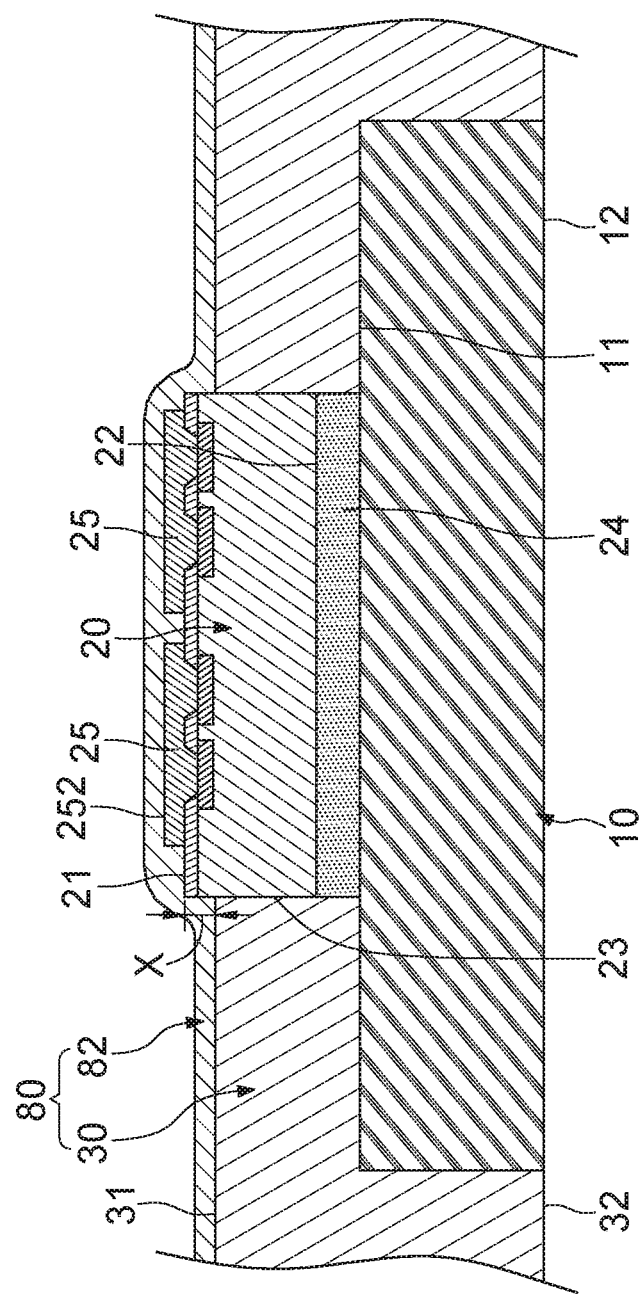
FIG. 11 illustrates one or more stages of an example of a method for manufacturing a semiconductor package structure according to some embodiments of the present disclosure.

Referring to FIG. 11, the multi-layer film 80 is laminated on the base 10 to allow the first dielectric layer 30 to cover the base 10 and a portion of the semiconductor element 20. The release film 82 may cover the upper surface 21 and the first terminals 25 of the semiconductor element 20 to prevent the first dielectric layer 30 from covering the upper surface 21 and the first terminals 25.

As shown in FIG. 11, the first dielectric layer 30 has a top surface 31 and a bottom surface 32 opposite to the top surface 31. In some embodiments, the first dielectric layer 30 may cover at least a portion of the peripheral surface 23 of the semiconductor element 20, thus the top surface 31 of the first dielectric layer 30 may be substantially non-coplanar with the upper surface 21 of the semiconductor element 20.

In some embodiments, the top surface 31 of the first dielectric layer 30 may be lower than the upper surface 21 of the semiconductor element 20. Thus, there is a height difference X between the top surface 31 of the first dielectric layer 30 and the upper surface 21 of the semiconductor element 20. That is, a top portion of the semiconductor element 20 may protrude from the first dielectric layer 30. The height difference X may be less than or equal to about 30 μm to prevent the first dielectric layer 30 from covering the upper surface 21 of the semiconductor element 20. Alternatively, the height difference X may be greater than or equal to about 5 μm. In some embodiments, the height difference X may be about 5 μm to about 30 μm. Further, the bottom surface 32 of the first dielectric layer 30 may be substantially coplanar with the bottom surface 12 of the base 10.

Figure 12:
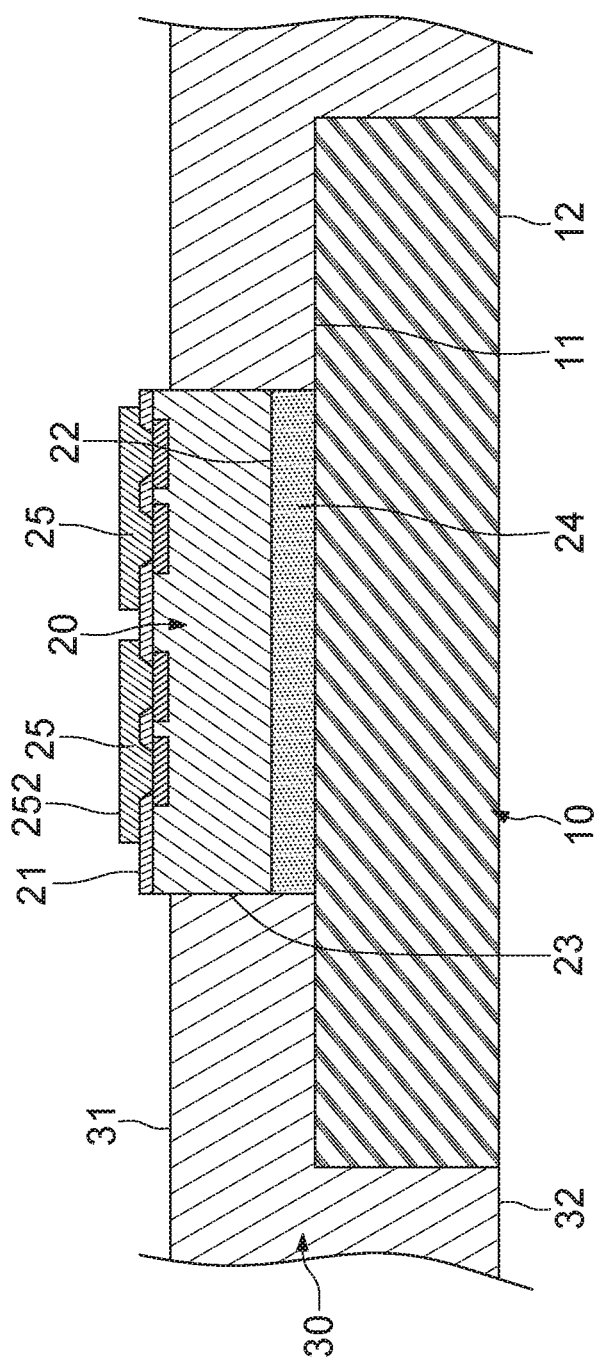
FIG. 12 illustrates one or more stages of an example of a method for manufacturing a semiconductor package structure according to some embodiments of the present disclosure.

Referring to FIG. 12, the release film 82 is removed.

Figure 13:
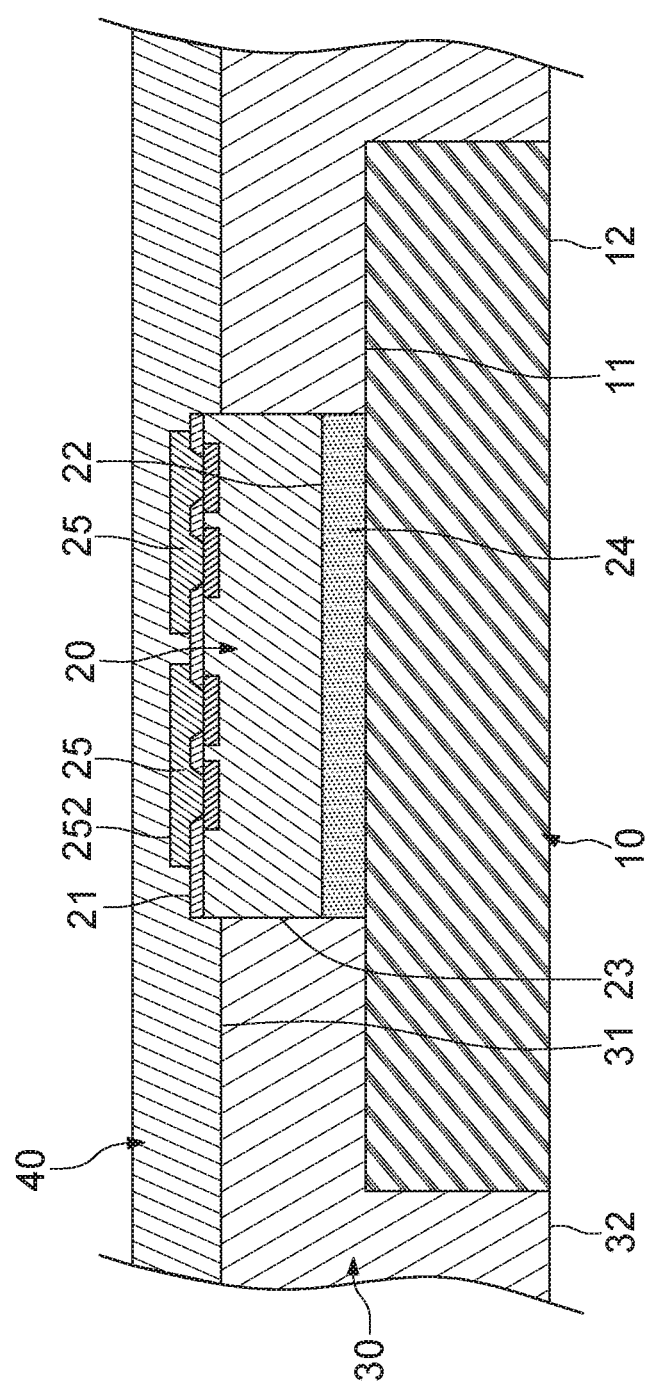
FIG. 13 illustrates one or more stages of an example of a method for manufacturing a semiconductor package structure according to some embodiments of the present disclosure.

Referring to FIG. 13, a second dielectric layer 40 is formed to cover the semiconductor element 20 and the first dielectric layer 30. The second dielectric layer 40 may be made from a photosensitive material or photoimageable material such as a solder mask.

Figure 14:
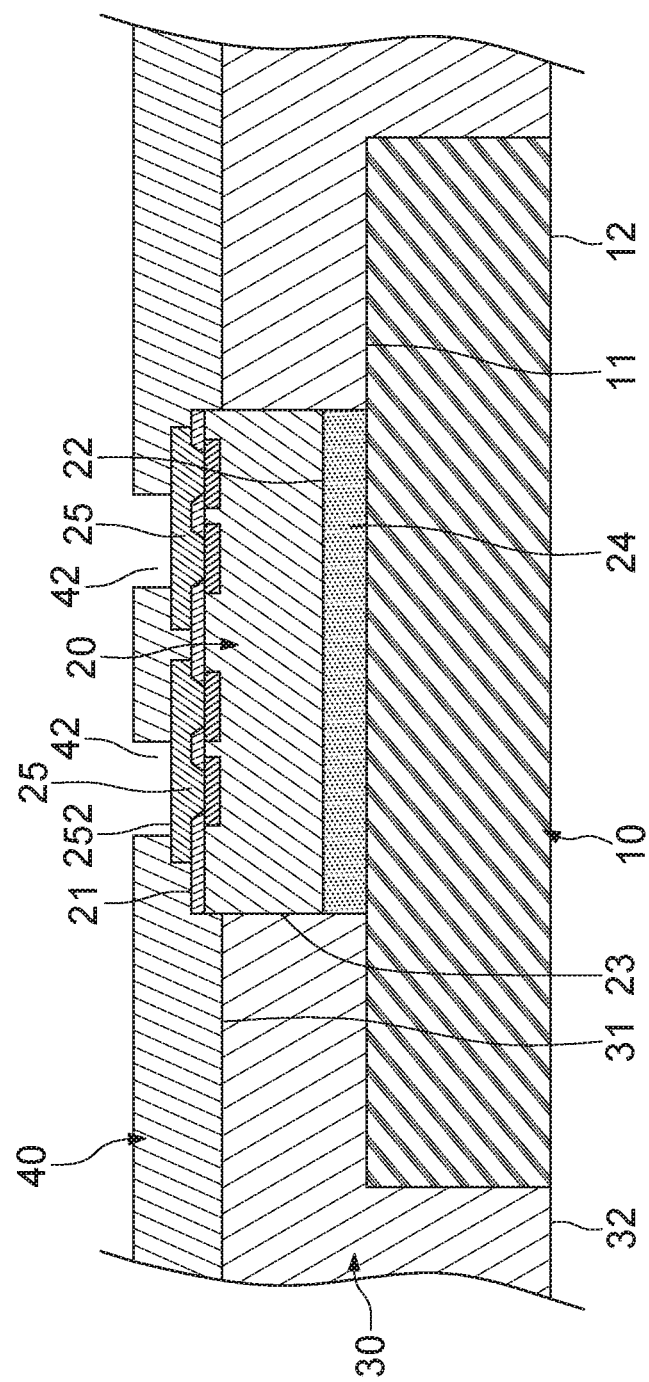
FIG. 14 illustrates one or more stages of an example of a method for manufacturing a semiconductor package structure according to some embodiments of the present disclosure.

Referring to FIG. 14, a plurality of openings 42 are formed to extend through the second dielectric layer 40 to expose a portion (e.g., a portion of a top surface 252) of each of the first terminals 25 by, for example, exposure and development processes. Since the openings 42 are not formed by laser drilling, the manufacturing cost may be reduced.

Figure 15:
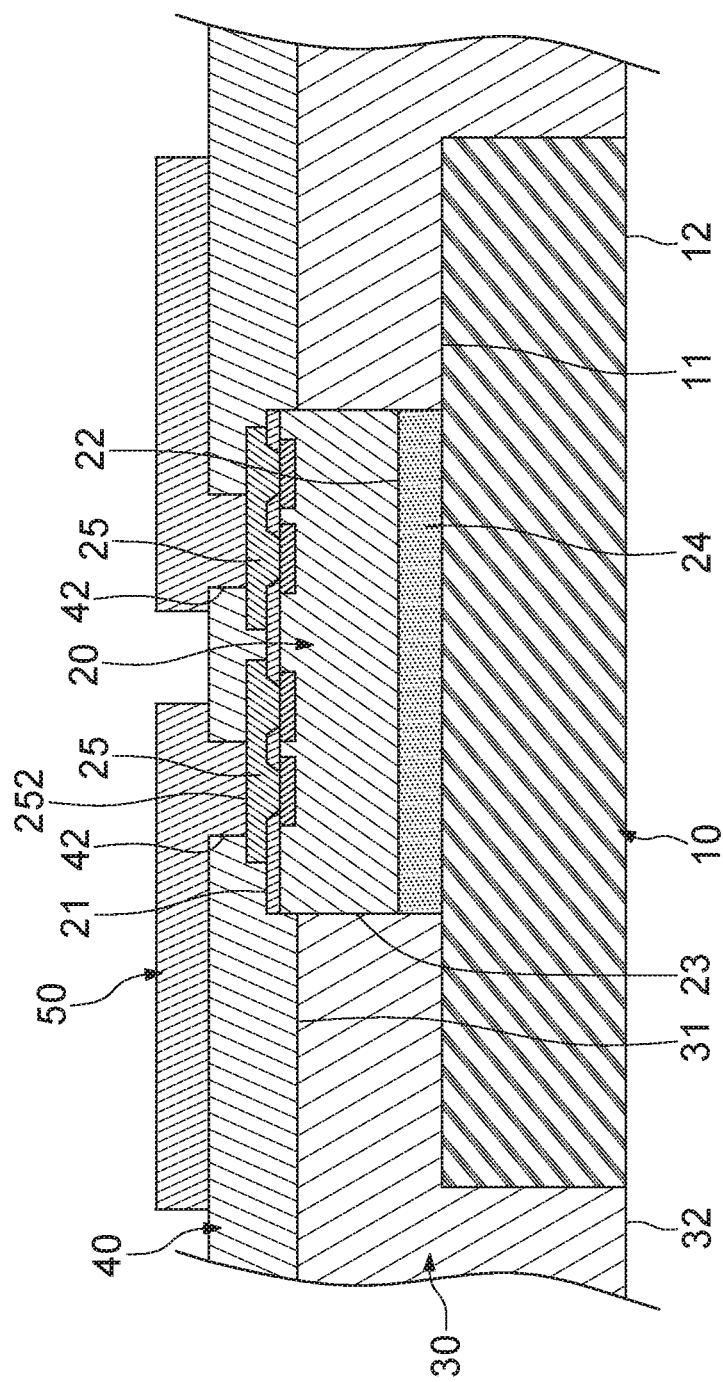
FIG. 15 illustrates one or more stages of an example of a method for manufacturing a semiconductor package structure according to some embodiments of the present disclosure.

Referring to FIG. 15, a circuit layer 50 is formed to extend through the second dielectric layer 40 to electrically connect the semiconductor element 20. In some embodiments, the circuit layer 50 may be formed on the second dielectric layer 40 and in the openings 42 of the second dielectric layer 40. Further, the circuit layer 50 may electrically connect or contact the exposed portion (e.g., the exposed portion of the top surface 252) of each of the first terminals 25.

Figure 16:
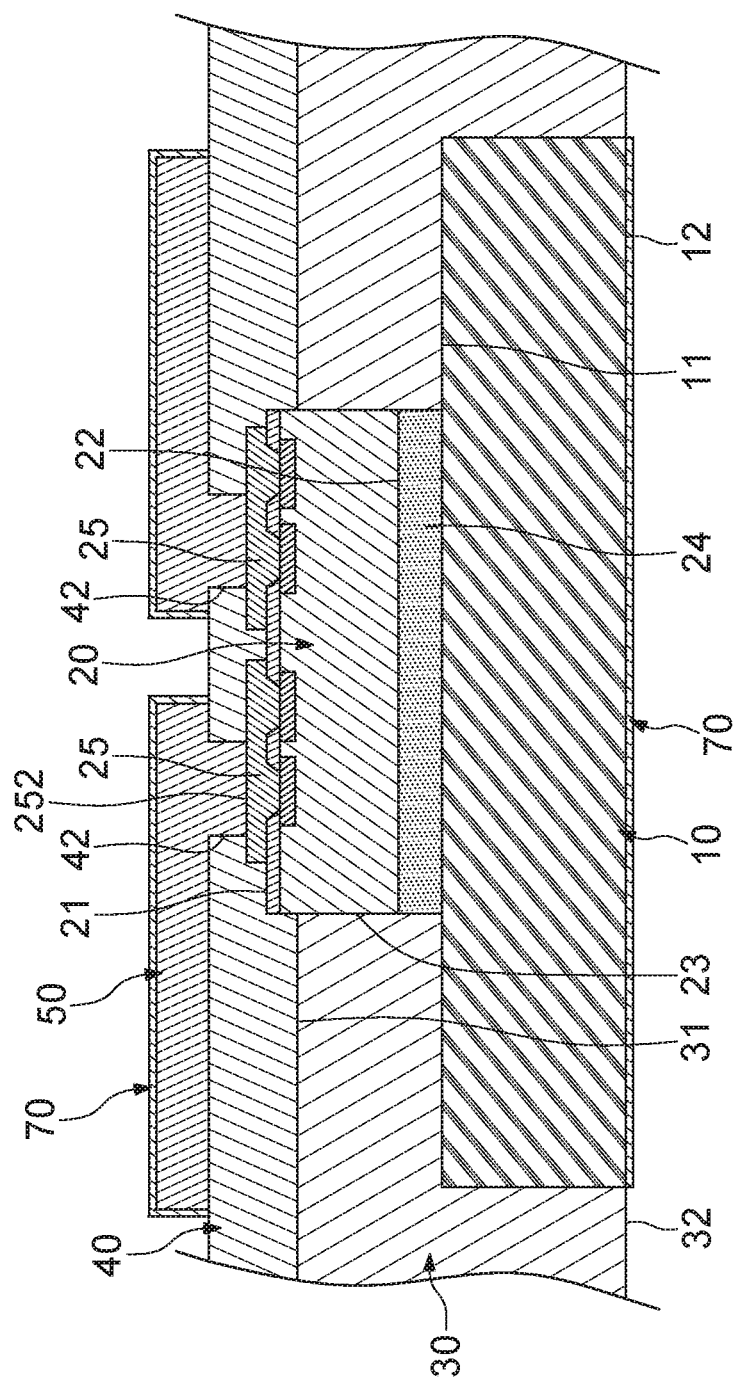
FIG. 16 illustrates one or more stages of an example of a method for manufacturing a semiconductor package structure according to some embodiments of the present disclosure.

Referring to FIG. 16, a surface finishing layer 70 is formed to cover the circuit layer 50 and the bottom surface 12 of the base 10. The surface finishing layer 70 may prevent the circuit layer 50 and the base 10 from oxidation.

Then, a singulation process is conducted to obtain a plurality of semiconductor package structures 1 of FIG. 1.

Figure 17:
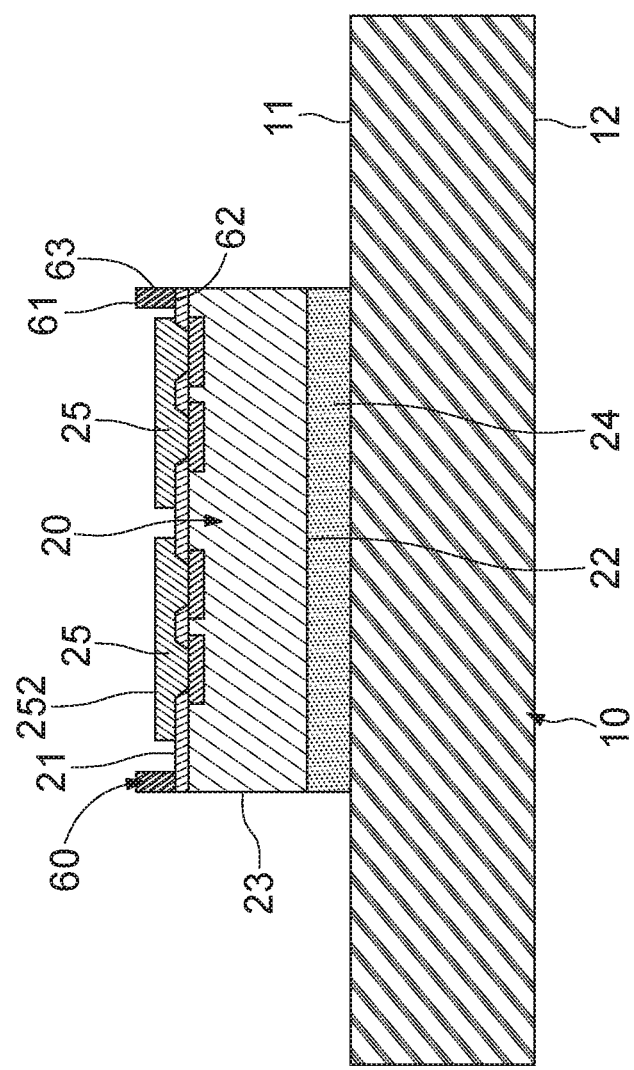
FIG. 17 illustrates one or more stages of an example of a method for manufacturing a semiconductor package structure according to some embodiments of the present disclosure.

FIG. 17 through FIG. 24 illustrate a method for manufacturing a semiconductor package structure according to some embodiments of the present disclosure. In some embodiments, the method is for manufacturing a semiconductor package structure such as the semiconductor package structure 1a shown in FIG. 2. The initial several stages of the illustrated process are the same as, or similar to, the stages illustrated in FIG. 7 through FIG. 8. FIG. 17 depicts a stage subsequent to that depicted in FIG. 8.

Referring to FIG. 17, at least one dam 60 is formed or disposed on the upper surface 21 of the semiconductor element 20 to surround the first terminals 25. In some embodiments, the dam 60 may be in a ring shape from a top view and may be disposed at the periphery of the upper surface 21 of the semiconductor element 20. The dam 60 has an upper surface 61, a lower surface 62 opposite to the upper surface 61 and an outer lateral surface 63 extending between the upper surface 61 and the lower surface 62. The lower surface 62 may be attached to the upper surface 21 of the semiconductor element 20.

Figure 18:
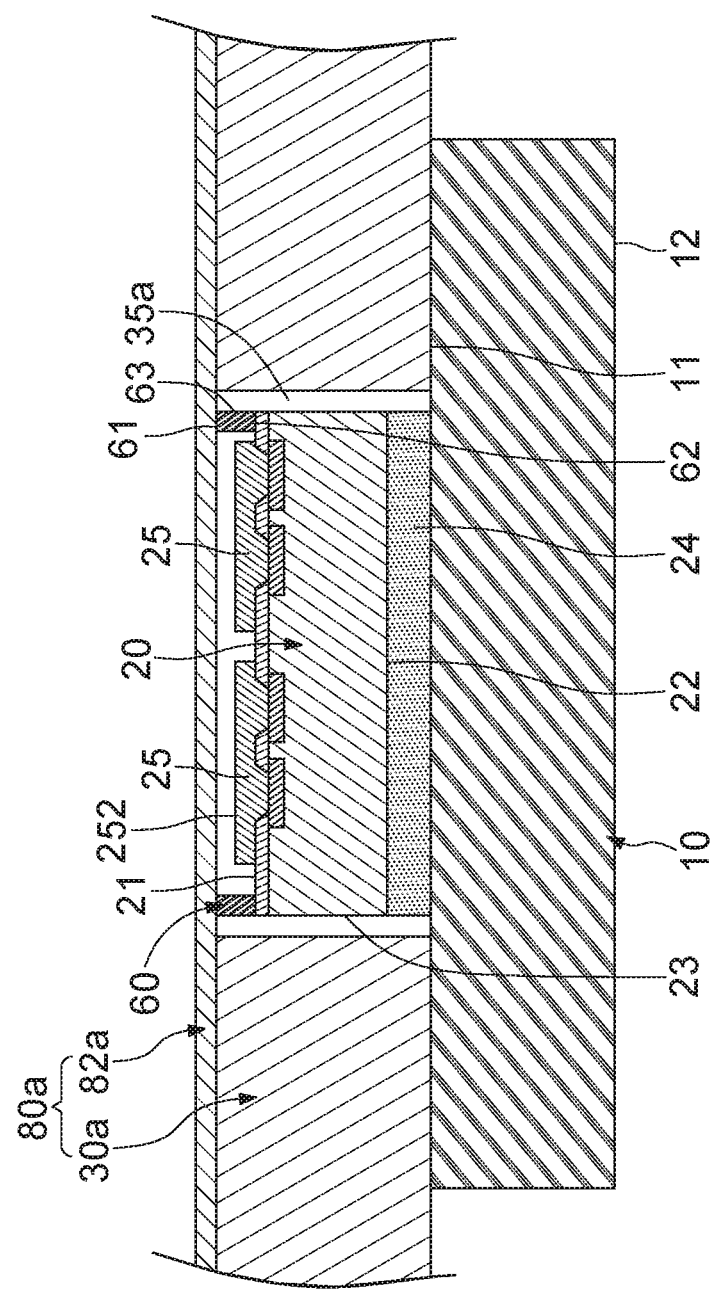
FIG. 18 illustrates one or more stages of an example of a method for manufacturing a semiconductor package structure according to some embodiments of the present disclosure.
Figure 19:
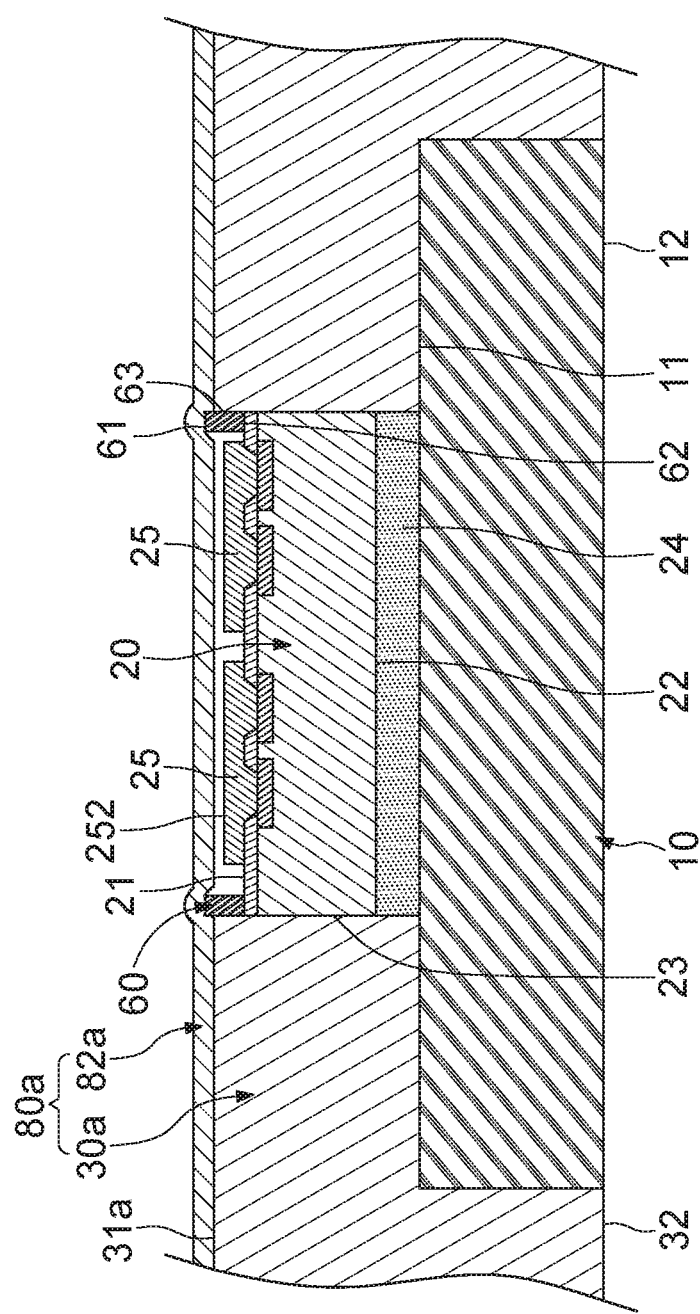
FIG. 19 illustrates one or more stages of an example of a method for manufacturing a semiconductor package structure according to some embodiments of the present disclosure.
Figure 20:
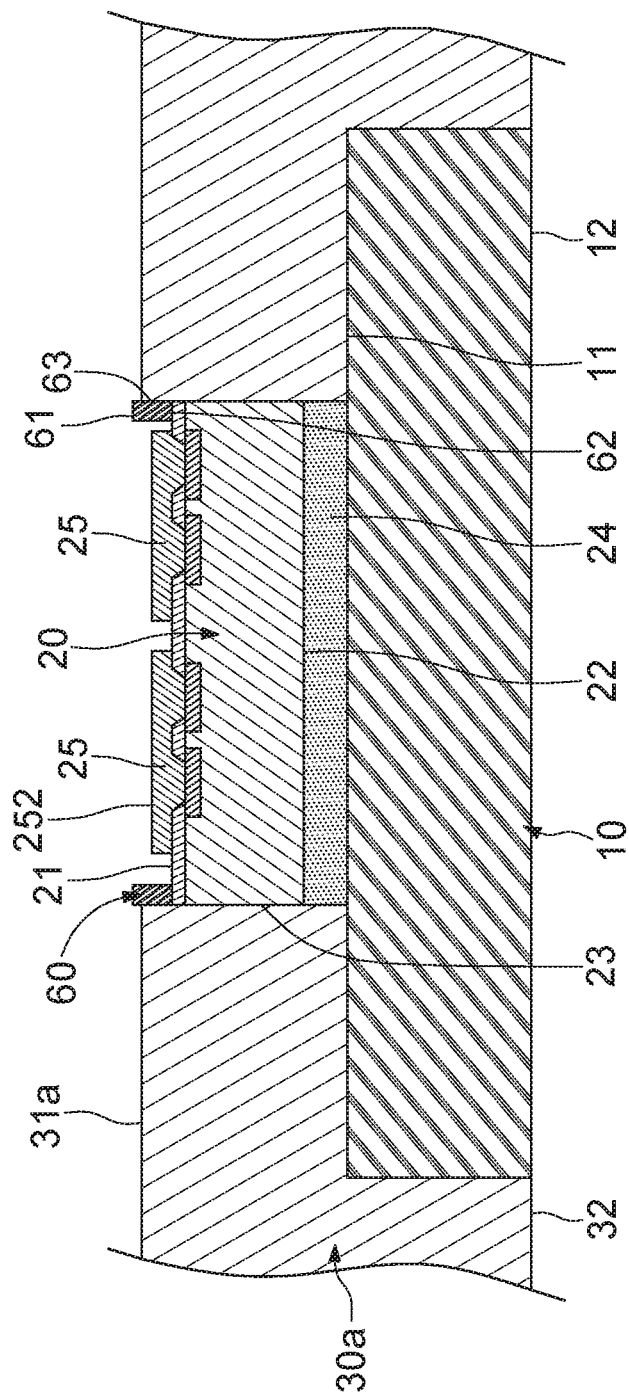
FIG. 20 illustrates one or more stages of an example of a method for manufacturing a semiconductor package structure according to some embodiments of the present disclosure.

Referring to FIG. 18 through FIG. 20, a first dielectric layer 30a is formed to cover the base 10 and a portion of the semiconductor element 20. Referring to FIG. 18, a multi-layer film 80a is provided and disposed on the base 10. The multi-layer film 80a includes a release film 82a and the first dielectric layer 30a attached on the release film 82a. The material of the first dielectric layer 30a may be, for example, polypropylene (PP). In some embodiments, a plurality of glass fibers may be embedded in the first dielectric layer 30a to improve the material strength of the first dielectric layer 30a. In addition, the first dielectric layer 30a may define an opening 35a to accommodate the semiconductor element 20.

Referring to FIG. 19, the multi-layer film 80a is laminated on the base 10 to allow the first dielectric layer 30a to cover the base 10 and the portion of the semiconductor element 20. The release film 82a may cover the dam 60 to prevent the first dielectric layer 30a over the dam 60 from covering the upper surface 21 and the first terminals 25 of the semiconductor element 20.

As shown in FIG. 19, a top surface 31a of the first dielectric layer 30a may be higher than the upper surface 21 of the semiconductor element 20 and the dam 60 may protrude from the top surface 31a of the first dielectric layer 30a. That is, the upper surface 61 of the dam 60 is higher than the top surface 31a of the first dielectric layer 30a, and the first dielectric layer 30a covers a portion (e.g., a portion of the outer lateral surface 63) of the dam 60 and a whole of the peripheral surface 23 of the semiconductor element 20.

Referring to FIG. 20, the release film 82a is removed.

Figure 21:
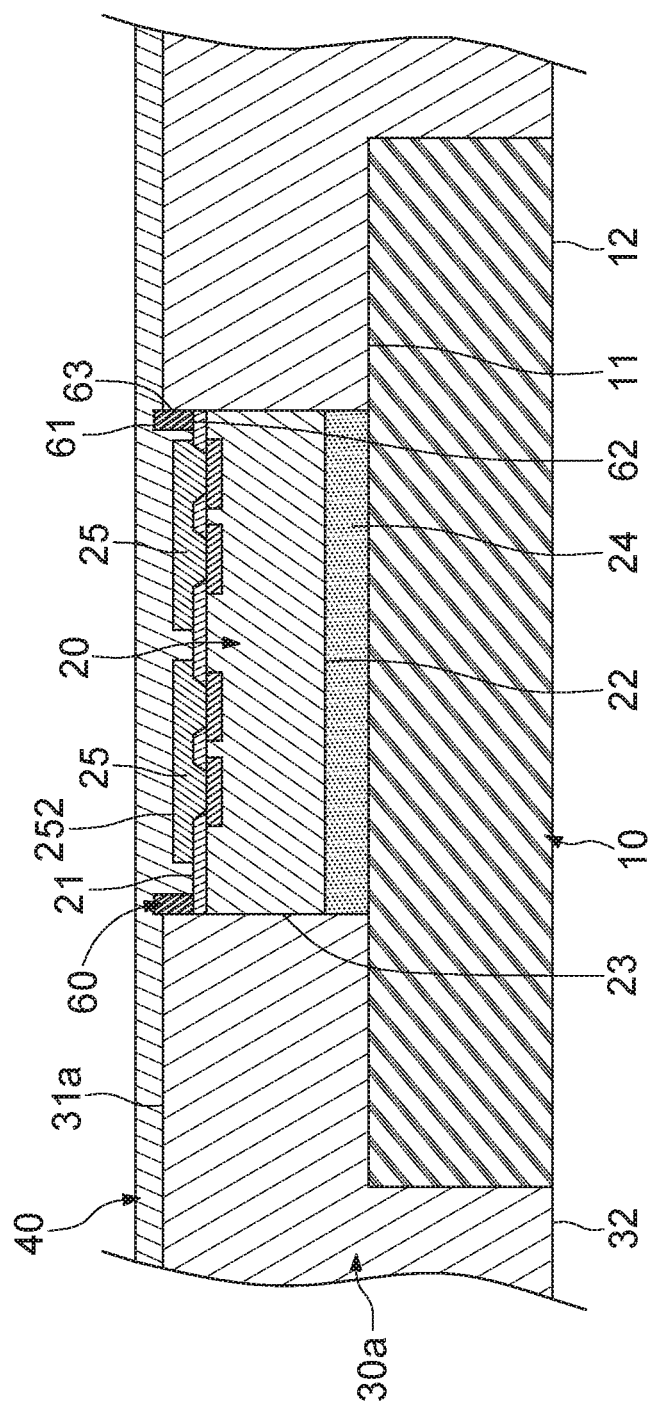
FIG. 21 illustrates one or more stages of an example of a method for manufacturing a semiconductor package structure according to some embodiments of the present disclosure.

Referring to FIG. 21, a second dielectric layer 40 is formed to cover the dam 60, the semiconductor element 20 and the first dielectric layer 30a. The second dielectric layer 40 may be made from a photosensitive material.

Figure 22:
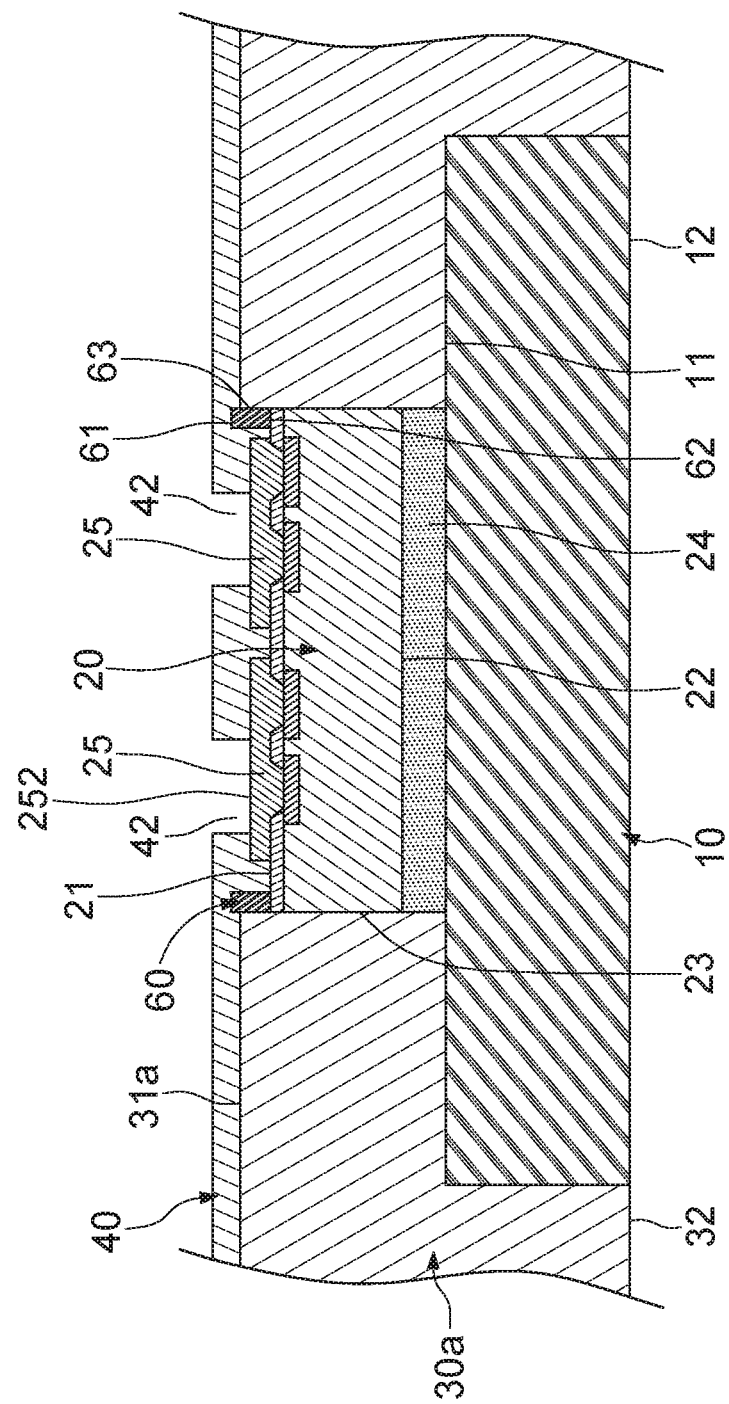
FIG. 22 illustrates one or more stages of an example of a method for manufacturing a semiconductor package structure according to some embodiments of the present disclosure.

Referring to FIG. 22, a plurality of openings 42 are formed to extend through the second dielectric layer 40 to expose a portion (e.g., a portion of a top surface 252) of each of the first terminals 25 by, for example, exposure and development processes. Since the openings 42 are not formed by laser drilling, the manufacturing cost may be reduced.

Figure 23:
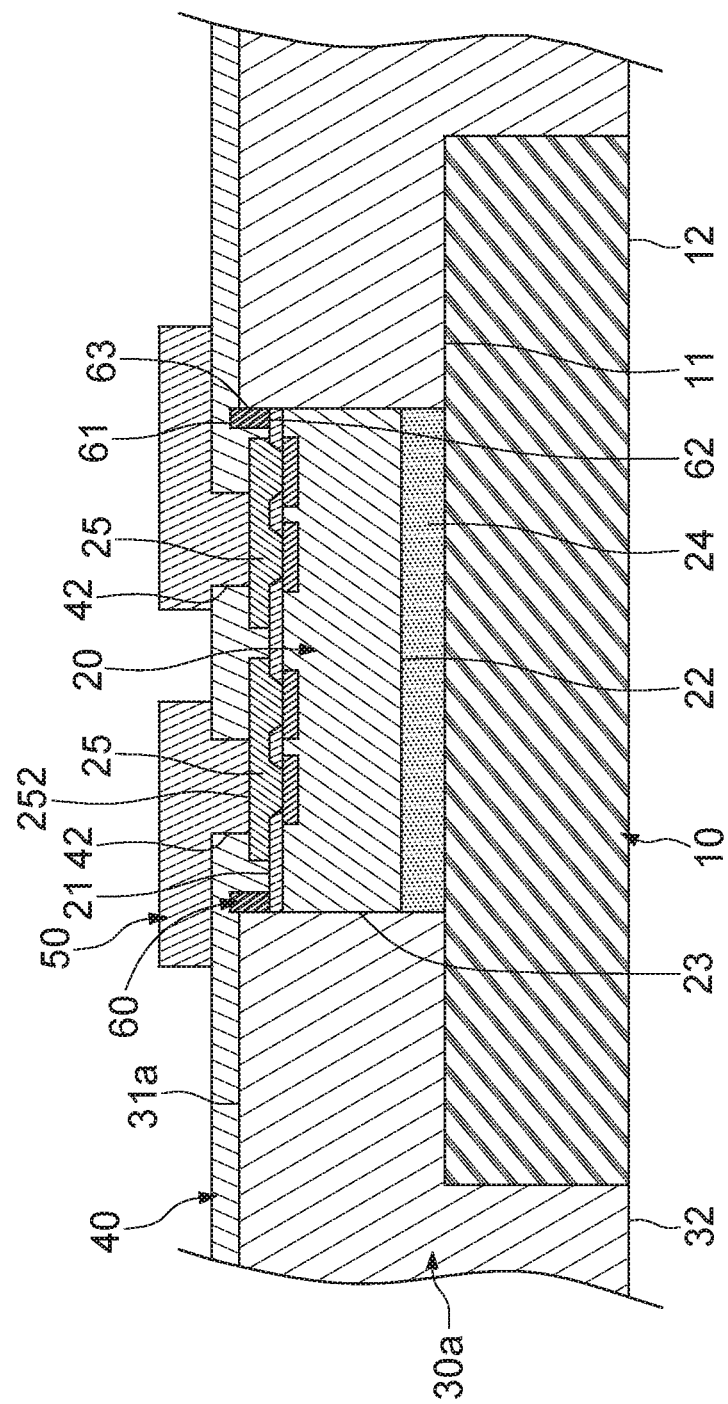
FIG. 23 illustrates one or more stages of an example of a method for manufacturing a semiconductor package structure according to some embodiments of the present disclosure.

Referring to FIG. 23, a circuit layer 50 is formed to extend through the second dielectric layer 40 to electrically connect the semiconductor element 20. In some embodiments, the circuit layer 50 may be formed on the second dielectric layer 40 and in the openings 42 of the second dielectric layer 40. Further, the circuit layer 50 may electrically connect or contact the exposed portion (e.g., the exposed portion of the top surface 252) of each of the first terminals 25.

Figure 24:
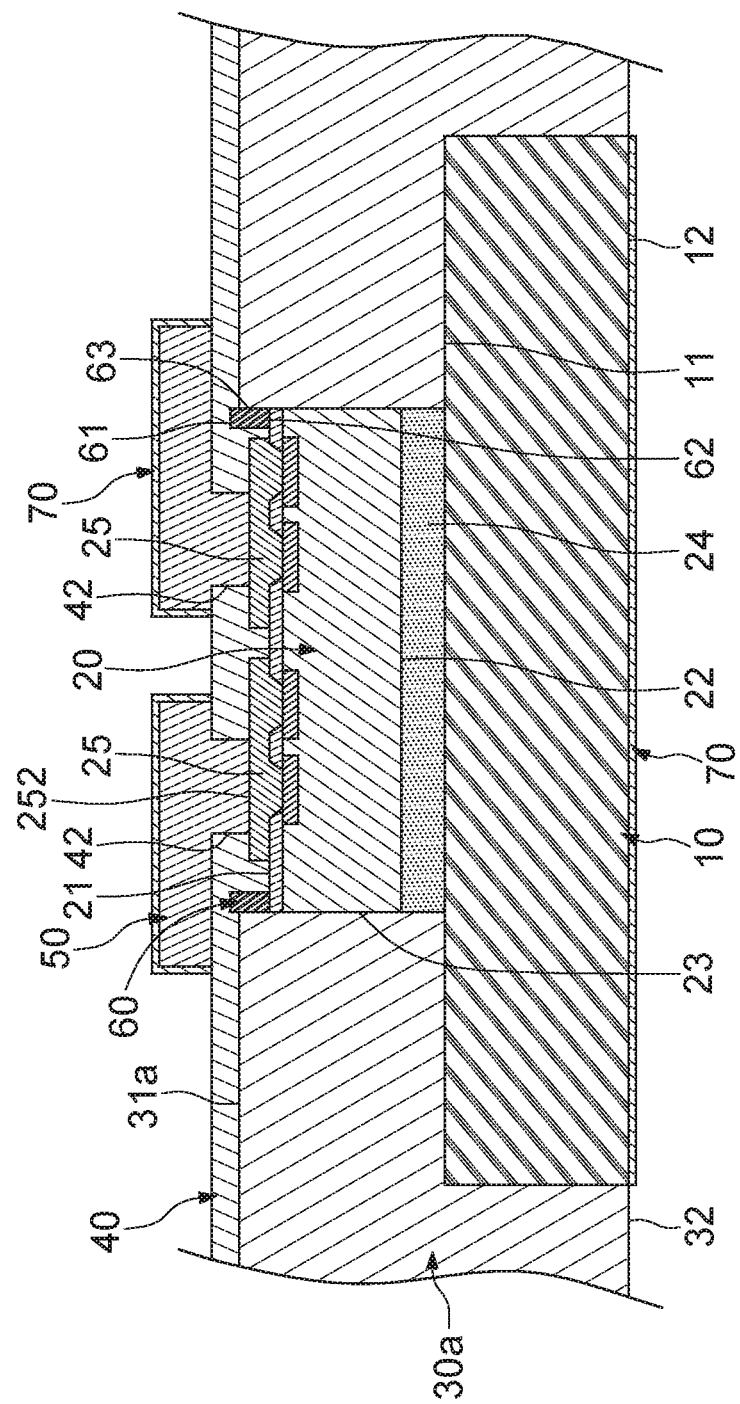
FIG. 24 illustrates one or more stages of an example of a method for manufacturing a semiconductor package structure according to some embodiments of the present disclosure.

Referring to FIG. 24, a surface finishing layer 70 is formed to cover the circuit layer 50 and the bottom surface 12 of the base 10. The surface finishing layer 70 may prevent the circuit layer 50 and the base 10 from oxidation.

Then, a singulation process is conducted to obtain a plurality of semiconductor package structures 1a of FIG. 2.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a base;
   at least one semiconductor element disposed on the base and having an upper surface;
   a first dielectric layer covering at least a portion of a peripheral surface of the semiconductor element and having a top surface, wherein the top surface is non-coplanar with the upper surface of the semiconductor element;
   a second dielectric layer covering the semiconductor element and the first dielectric layer;
   a circuit layer extending through the second dielectric layer to electrically connect first terminals of the semiconductor element; and
   at least one dam disposed on the upper surface of the semiconductor element surrounding the first terminals and protruding from the top surface of the first dielectric layer, wherein the base has a surface and includes at least one conductive pillar protruding from the surface, and the conductive pillar protrudes from the top surface of the first dielectric layer.

2. The semiconductor package structure of claim 1, wherein the second dielectric layer is made from a photosensitive material.

3. The semiconductor package structure of claim 1, wherein the top surface of the first dielectric layer is lower than the upper surface of the semiconductor element.

4. The semiconductor package structure of claim 1, wherein a height difference between the top surface of the first dielectric layer and the upper surface of the semiconductor element is less than or equal to about 30 µm.

5. The semiconductor package structure of claim 4, wherein the height difference is about 5 µm to about 30 µm.

6. The semiconductor package structure of claim 1, wherein the semiconductor element is a power chip.

7. The semiconductor package structure of claim 1, wherein the second dielectric layer defines at least one opening extending through the second dielectric layer to expose a portion of the conductive pillar, and the circuit layer extends into the opening and contacts the exposed portion of the conductive pillar.

8. The semiconductor package structure of claim 1, wherein the conductive pillar has a top surface lower than an upper surface of the semiconductor element.

9. The semiconductor package structure of claim 1, wherein the base has a surface and defines at least one cavity recessed from the surface, and the semiconductor element is disposed in the cavity.

10. The semiconductor package structure of claim 9, wherein the first dielectric layer covers the cavity of the base.

11. A semiconductor package structure, comprising:
    a base having a surface and including at least one conductive pillar protruding from the surface;
    at least one semiconductor element disposed on the surface of the base;
    a first dielectric layer covering a portion of the conductive pillar and a portion of the semiconductor element, wherein the conductive pillar protrudes from a top surface of the first dielectric layer;
    a second dielectric layer covering the conductive pillar, the semiconductor element and the first dielectric layer;
    a circuit layer extending through the second dielectric layer to electrically connect first terminals of the semiconductor element; and
    at least one dam disposed on an upper surface of the semiconductor element surrounding the first terminals and protruding from the top surface of the first dielectric layer.

12. The semiconductor package structure of claim 11, wherein a height of the conductive pillar is less than a thickness of the semiconductor element.

13. The semiconductor package structure of claim 11, wherein the semiconductor element has an upper surface and a lower surface opposite to the upper surface, and includes a plurality of first terminals disposed adjacent to the upper surface and at least one second terminal disposed adjacent to the lower surface, and the second terminal electrically connects the conductive pillar through the base.

14. The semiconductor package structure of claim 11, further comprising at least one semiconductor device disposed adjacent to a bottom surface of the base, wherein the base further includes at least one conductive pin spaced apart from the conductive pillar, and the semiconductor device electrically connects the conductive pin through at least one bonding wire.

15. The semiconductor package structure of claim 14, wherein the conductive pin protrudes from the top surface of the first dielectric layer.

16. The semiconductor package structure of claim 14, wherein the circuit layer electrically connects the conductive pin.

17. The semiconductor package structure of claim 11, wherein the second dielectric layer defines at least one opening extending through the second dielectric layer to expose a portion of the conductive pillar, and the circuit layer extends into the opening and contacts the exposed portion of the conductive pillar.

* * * * *